(12) United States Patent
Zhu

(10) Patent No.: US 9,461,068 B2
(45) Date of Patent: Oct. 4, 2016

(54) SEMICONDUCTOR ARRANGEMENTS AND METHODS FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/761,262

(22) PCT Filed: Mar. 11, 2013

(86) PCT No.: PCT/CN2013/072410
§ 371 (c)(1),
(2) Date: Jul. 15, 2015

(87) PCT Pub. No.: WO2014/121535
PCT Pub. Date: Aug. 14, 2014

(65) Prior Publication Data
US 2015/0357350 A1    Dec. 10, 2015

(30) Foreign Application Priority Data
Feb. 8, 2013   (CN) .......................... 2013 1 0050055

(51) Int. Cl.
*H01L 29/78*   (2006.01)
*H01L 27/12*   (2006.01)
(Continued)

(52) U.S. Cl.
CPC ......... *H01L 27/1211* (2013.01); *H01L 21/845* (2013.01); *H01L 29/0649* (2013.01);
(Continued)

(58) Field of Classification Search
CPC ........... H01L 27/1211; H01L 29/0649; H01L 29/165; H01L 29/42364; H01L 29/66484; H01L 29/66795; H01L 29/7842; H01L 29/7855
See application file for complete search history.

(56) References Cited

U.S. PATENT DOCUMENTS

| 5,610,083 A | 3/1997 | Chan et al. |
| 2005/0073005 A1* | 4/2005 | Nowak ................... H01L 21/84 257/347 |

(Continued)

FOREIGN PATENT DOCUMENTS

| CN | 1280388 A | 1/2001 |
| CN | 101958327 A | 1/2011 |
| JP | 2001-053281 A | 2/2001 |

OTHER PUBLICATIONS

International Search Report as issued in International Patent Application No. PCT/CN2013/072410, dated Nov. 14, 2013.
(Continued)

*Primary Examiner* — Allan R Wilson
(74) *Attorney, Agent, or Firm* — Pillsbury Winthrop Shaw Pittman LLP

(57) ABSTRACT

Semiconductor arrangements and methods for manufacturing the same are provided. In one embodiment, the arrangement may include: a semiconductor on insulator (SOI) substrate, comprising a base substrate, a buried dielectric layer, and a SOI layer; a back gate formed on the SOI substrate and passing through the buried dielectric layer to be in electric contact with the base substrate; fins formed from the SOI layer on opposite sides of the back gate; and back gate dielectric layers interposed between the back gate and the respective fins.

24 Claims, 15 Drawing Sheets

(51) Int. Cl.
H01L 29/66 (2006.01)
H01L 29/06 (2006.01)
H01L 29/423 (2006.01)
H01L 29/165 (2006.01)
H01L 21/84 (2006.01)

(52) U.S. Cl.
CPC ....... H01L29/165 (2013.01); H01L 29/42364 (2013.01); H01L 29/66484 (2013.01); H01L 29/66795 (2013.01); H01L 29/7842 (2013.01); H01L 29/7855 (2013.01)

(56) References Cited

U.S. PATENT DOCUMENTS

2006/0091463 A1* 5/2006 Donze .................... H01L 21/84
257/353
2007/0259501 A1* 11/2007 Xiong ................... H01L 21/845
438/283
2008/0149984 A1* 6/2008 Chang .................. H01L 27/108
257/314
2008/0203491 A1* 8/2008 Anderson ......... H01L 29/66795
257/372
2013/0102116 A1* 4/2013 Xiao ..................... H01L 21/782
438/157

OTHER PUBLICATIONS

Written Opinion of the International Searching Authority as issued in International Patent Application No. PCT/CN2013/072410, dated Nov. 14, 2013.
Chinese Office Action dated Apr. 1, 2016 in corresponding Chinese Patent Application No. 201310050055.9.

* cited by examiner (a)

(b)

(a)

(b)

SEMICONDUCTOR ARRANGEMENTS AND METHODS FOR MANUFACTURING THE SAME

CROSS-REFERENCE TO RELATED APPLICATION(S)

This application is a U.S. national phase application of PCT Patent Application No. PCT/CN2013/072410, filed on Mar. 11, 2013, which claims priority to Chinese Application No. 201310050055.9, filed on Feb. 8, 2013, entitled "SEMICONDUCTOR ARRANGEMENTS AND METHODS FOR MANUFACTURING THE SAME," which is incorporated herein by reference in its entirety.

TECHNICAL FIELD

The present disclosure relates to the semiconductor field, and particularly, to semiconductor arrangements comprising fin structures and methods for manufacturing the same.

BACKGROUND

To deal with challenges caused by the continuous scaling down of semiconductor devices, such as short channel effects, various high-performance devices, such as ultra-thin body and buried oxide (UTBB) and fin field effect transistor (FinFET) devices, are proposed.

The UTBB device utilizes an extremely thin semiconductor on insulator (ET-SOI) substrate. The SOI substrate can suppress the short channel effects due to a buried oxide (BOX) therein. Further, a back gate may be disposed on a back side of the SOI substrate, to control a threshold voltage of the device, and thus to reduce power consumption of the device (by, for example, enhancing the threshold voltage when the device is off and thus reducing current leakage). However, the ET-SOI substrate is significantly expensive and has problems such as self-heating. Further, the ET-SOI substrate is more and more difficult to manufacture with the trend of continuous scaling down.

The FinFET device is a 3D device, including a fin vertically formed on a substrate. A conductive channel may be formed in the fin. The fin may have its height increased while keeping its footprint unchanged, and thus may have an improved drive current per unit footprint. However, the FinFET device cannot effectively control its threshold voltage. Further, the fin becomes thinner and thinner with the trend of continuous scaling down, and tends to collapse during manufacture.

SUMMARY

The present disclosure provides, among others, semiconductor arrangements and methods for manufacturing the same.

According to an aspect of the present disclosure, there is provided a semiconductor arrangement, comprising: a semiconductor on insulator (SOI) substrate, comprising a base substrate, a buried dielectric layer, and a SOI layer; a back gate formed on the SOI substrate and passing through the buried dielectric layer to be in electric contact with the base substrate; fins formed from the SOI layer on opposite sides of the back gate; and back gate dielectric layers interposed between the back gate and the respective fins.

According to a further aspect of the present disclosure, there is provided a method of manufacturing a semiconductor arrangement, comprising: forming a back gate groove in a semiconductor on insulator (SOI) substrate, wherein the SOI substrate comprises a base substrate, a buried dielectric layer, and a SOI layer, and the back gate groove passes through the SOI layer and the buried dielectric layer; forming back gate dielectric layers on side walls of the back gate groove; forming a back gate by filling a conductive material into the back gate groove; and forming fins abutting the respective back gate dielectric layers by patterning the SOI layer.

According to embodiments of the present disclosure, the back gate is interposed between the fins, resulting in a sandwich fin (which is referred to in brief as sFin) configuration. Based on the sFin configuration, various devices, such as a sandwich fin field effect transistor (sFinFET), can be made. In such a sFin based device, it is possible not only to effectively control a threshold voltage of the device by the back gate, but also to improve its reliability by the back gate serving as a support for the fins.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
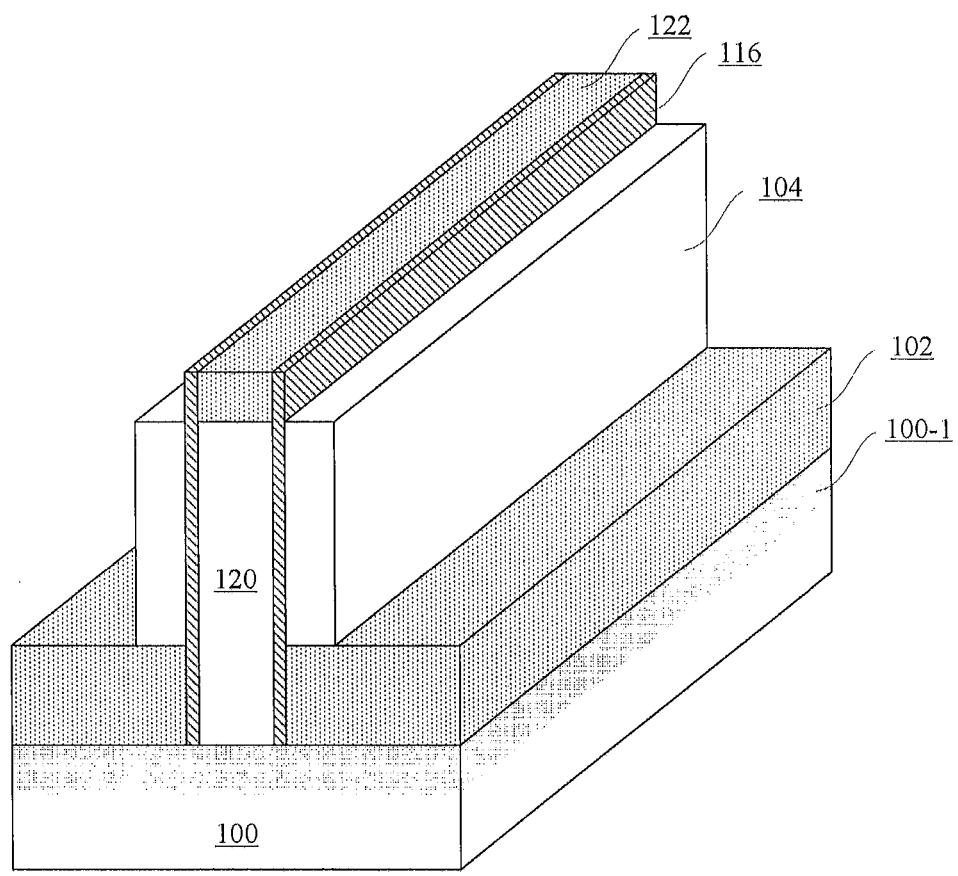
FIG. 1 is a perspective view showing a semiconductor arrangement according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacturing tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor arrangement. The semiconductor arrangement may comprise a semiconductor on insulator (SOI) substrate. The SOI substrate may comprise a base substrate (e.g., silicon), a buried dielectric layer (e.g., buried oxide (BOX)), and a SOI layer (e.g., silicon) stacked together.

The semiconductor arrangement may further comprise a sandwich fin (sFin) configuration. For example, the sFin configuration comprises two fins and a back gate interposed between the two fins. The respective fins and the back gate may be spaced apart from each other by gate dielectric layers. As a result, it is possible to control the fins by applying a bias to the back gate. In an example, the fins may be formed by patterning the SOI layer.

According to an embodiment of the present disclosure, the back gate may pass through the buried dielectric layer to be in electric contact with the base substrate. Thus, it is possible to apply the bias to the back gate via the base substrate. To improve an efficiency of applying the bias, a well region may be formed in the base substrate so that the back gate is in electric contact with the well region. The bias may be applied to the back gate through an electric contact to the well region. To further reduce a contact resistance between the back gate and the well region, a contact region may be formed in the well region at a position corresponding to the back gate. The contact region may have a greater doping concentration than that of the well region.

According to embodiments of the present disclosure, various semiconductor devices such as sFinFETs may be formed based on the sFin. Though the sFin comprises the back gate, it still looks like a fin as a whole. Therefore, existing FinFET manufacture processes and apparatuses are applicable to manufacture of sFinFETs. There is no need to newly develop manufacture processes and apparatuses for application of the technology disclosed herein.

The sFinFET may comprise a gate stack formed on the buried dielectric layer and intersecting the sFin. The gate stack defines a channel region (corresponding to a portion of each of the fins intersecting the gate stack) and thus source/drain regions (corresponding to portions of each of the fins on opposite sides of the channel region) in the fins. In an example, the gate stack may intersect a side surface (opposite to the back gate) and a top surface of each of the fins included in the sFin, so that conductive channels may be formed on the side surface and the top surface (under control of the gate stack), resulting in a four-gate device (specifically, the gate stack constitutes gates on the side and top surfaces of each of the fins). To avoid interference between the gate stack and the back gate, they may have a dielectric layer disposed therebetween and thus electrically isolated from each other.

According to embodiments, to improve the device performance, strained source/drain technology may be applied. For example, the source/drain regions may comprise a semiconductor layer having a material different from that of the fins to apply stress to the channel region. For example, for a p-type device, compressive stress may be applied; or for a n-type device, tensile stress may be applied.

According to embodiments of the present disclosure, the sFin may be formed as follows. For example, a back gate groove may be formed in the SOI substrate to pass through the SOI layer and the buried dielectric layer, and a back gate may be formed by filling a conductive material, such as metal or doped semiconductor (e.g., poly silicon), into the back gate groove. Before filling the back gate groove, back gate dielectric layers may be formed on side walls of the back gate groove. In an example, the back gate dielectric layers may be formed in a spacer formation process for simplification. Next, the SOI layer may be patterned to form fins abutting the respective back gate dielectric layers. For example, the SOI layer may be patterned in such a manner that (fin-like) portions of the SOI layer are left on the side walls of the back gate groove (specifically, on the respective back gate dielectric layers formed on the side walls of the back gate groove).

For convenience of patterning of the back gate groove and the fins, in an example a patterning auxiliary layer may be formed on the SOI substrate. The patterning auxiliary layer may be patterned to have an opening at a position corresponding to the back gate groove, and a pattern transfer layer may be formed on side walls of the patterning auxiliary layer facing the opening. Thus, the patterning of the back gate groove (referred to as "first patterning" hereinafter) may be performed with the patterning auxiliary layer and the pattern transfer layer as a mask. Further, the patterning of the fins (referred to as "second patterning" hereinafter) may be performed with the pattern transfer layer as a mask.

In this way, the fins are formed by patterning two times: the first patterning in which one side surface of each of the fins is formed, and the second patterning in which the other side surface of each of the fins is formed. During the first patterning, the fins are still connected to, and thus are supported by, the body of the SOI layer. Further, during the second patterning, the fins are connected to, and thus are supported by, the back gate. As a result, it is possible to prevent the fins from collapsing during its manufacture, and thus the relatively thin fins can be manufactured at a greater yield.

Before the second patterning, a dielectric layer may be formed in the back gate groove to cover the back gate. The dielectric layer may electrically isolate the back gate (from, e.g., the gate stack) on one hand, and may prevent impacts of the second patterning on the back gate on the other hand.

Further, for convenience of patterning, in an example the pattern transfer layer may be formed on the side walls of the patterning auxiliary layer in a spacer formation process. Because the spacer formation process needs no mask, it is possible to reduce a number of masks used in the manufacture.

According to an embodiment, the SOI layer may comprise any of Si, Ge, SiGe, GaAs, GaSb, AlAs, InAs, InP, GaN, SiC, InGaAs, InSb, or InGaSb, and the patterning auxiliary layer may comprise amorphous silicon. In this case, to avoid unwanted etching of the patterning auxiliary layer during the patterning of the back gate groove, a protection layer may be formed on a top surface of the patterning auxiliary layer. Further, before formation of the patterning auxiliary layer, a stop layer may be formed on the SOI substrate. Patterning of the patterning auxiliary layer (to form the opening therein) may stop on the stop layer. For example, the protection layer may comprise nitride (e.g., silicon nitride), the pattern transfer layer may comprise nitride, and the stop layer may comprise oxide (e.g., silicon oxide).

The technology disclosed herein may be presented in various ways, some of which will be described in the following by way of example.

FIG. 1 is a perspective view showing a semiconductor arrangement according to an embodiment of the present disclosure. As shown in FIG. 1, the semiconductor arrangement comprises a SOI substrate. The SOI substrate comprises a base substrate 100 (e.g., silicon), a buried dielectric layer 102 (e.g., oxide) disposed on the base substrate 100, and a SOI layer 104 (e.g., silicon) disposed on the buried dielectric layer 102. It is to be noted that the substrate is not limited to silicon system materials, and may comprise different semiconductor based materials, such as Ge system materials. The following descriptions are directed to the silicon system materials for convenience.

The semiconductor arrangement further comprises a sFin configuration formed on the SOI substrate. Specifically, the sFin configuration may comprise two fins 104 formed from the SOI layer and a back gate 120 interposed between the fins. The fins 104 each may have a width of about 3-38 nm for example, and are separated from the back gate 120 by respective back gate dielectric layers 116. The back gate dielectric layers 116 each may comprise a suitable dielectric material, e.g., a high-K dielectric material such as $HfO_2$, with a thickness (i.e., a dimension in a horizontal direction in the sheet) of about 2-20 nm. The back gate 120 may comprise a suitable conductive material, such as TiN, W, or a combination thereof, with a width (i.e., a dimension in the horizontal direction in the sheet) of about 5-30 nm. Alternatively, the back gate 120 may comprise a doped (and thus conductive) semiconductor material at a polarity (p-type or n-type) which can be selected to adjust a threshold voltage. The back gate 120 may pass through the buried dielectric layer 102 to be in electric contact with the base substrate 100. Thus, it is possible to apply a bias to the back gate 120 via the base substrate 100. To do this, the base substrate 100 may comprise a well region 100-1 to enhance the electric contact with the back gate 120.

FIG. 1 also shows a dielectric layer 122 disposed on a top surface of the back gate 120. The dielectric layer 122 may electrically isolate the back gate 120 from other components (e.g., a gate stack to be described later) formed on a front side (the upper side in FIG. 1) of the SOI substrate.

Figure 2:
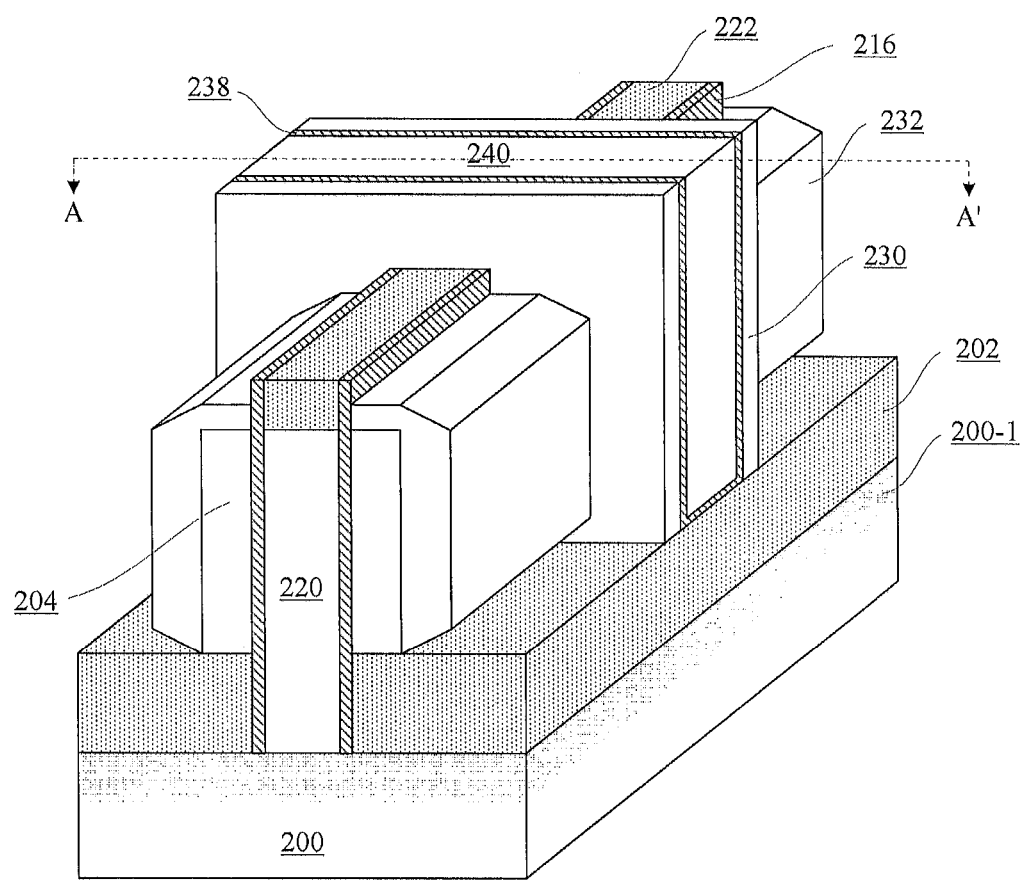
FIG. 2 is a perspective view showing a semiconductor arrangement according to a further embodiment of the present disclosure.
Figure 3:
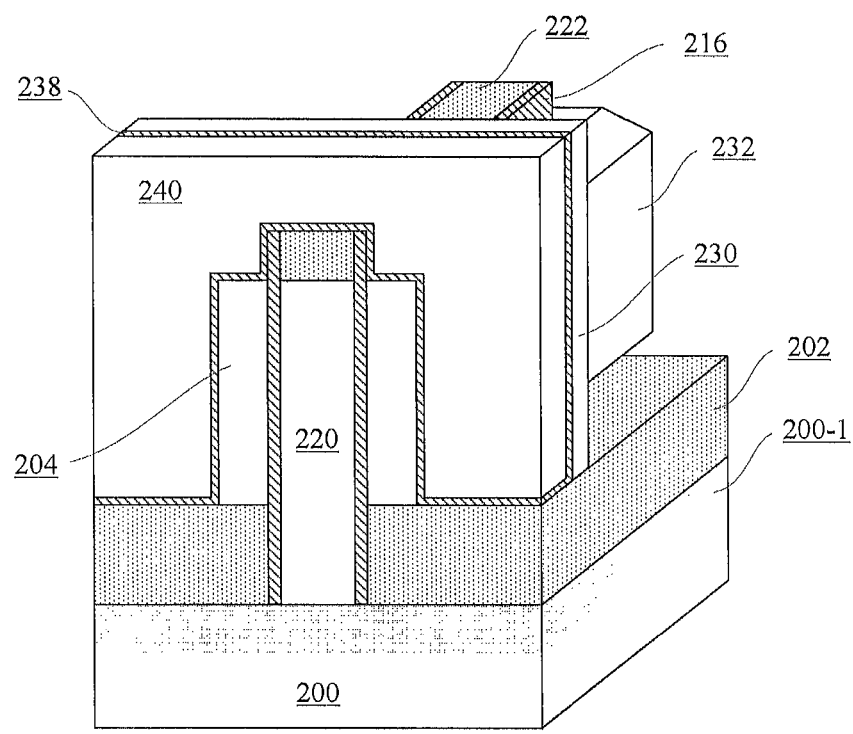
FIG. 3 is a perspective view showing the semiconductor arrangement of FIG. 2 which is cut off.

FIG. 2 is a perspective view showing a semiconductor arrangement according to a further embodiment of the present disclosure, and FIG. 3 is a perspective view showing the semiconductor arrangement of FIG. 2 which is cut off along A-A'. Likewise, the semiconductor arrangement shown in FIGS. 2 and 3 comprises a SOI substrate and a sFin formed on the SOI substrate. Similarly to the embodiment shown in FIG. 1, the SOI substrate may comprise a base substrate 200, a buried dielectric layer 202 disposed on the base substrate 200, and a SOI layer 204 disposed on the buried dielectric layer 202, and the sFin may comprise two fins 204 formed from the SOI layer and a back gate 220 interposed between the fins. The fins 204 are separated from the back gate 220 by respective back gate dielectric layers 216. To improve electric contact between the back gate 220 and the base substrate 200, the base substrate 200 may comprise a well region 200-1. For structural parameters and materials of those elements, reference may be made to the above descriptions with reference to FIG. 1.

Further, the semiconductor arrangement further comprises a gate stack formed on the SOI substrate (specifically, on the buried dielectric layer 202) and intersecting the sFin. For example, the gate stack may comprise a gate dielectric layer 238 and a gate conductor layer 240. For example, the gate dielectric layer 238 may comprise a high-K dielectric material such as $HfO_2$, with a thickness of about 1-5 nm, and the gate conductor layer 240 may comprise a metal gate conductor. Further, the gate dielectric layer 238 may further comprise a thin oxide layer (on which the high-K gate dielectric layer is disposed), with a thickness of about 0.3-1.2 nm. A work function adjustment layer (not shown) may be disposed between the gate dielectric layer 238 and the gate conductor 240. Further, gate spacers 230 may be formed on opposite sides of the gate stack. For example, the gate spacers 230 each may comprise nitride, with a thickness of about 5-20 nm. The back gate 220 may be isolated from the gate stack by a dielectric layer 222 on a top surface thereof.

Due to the presence of the gate stack, a channel region (corresponding to a portion of each of the fins intersecting the gate stack) and source/drain regions (corresponding to portions of each of the fins on opposites sides of the channel region) are defined in the sFin. In the semiconductor arrangement shown in FIG. 2, a semiconductor layer 232 may be further grown on surfaces of the fins in the source/drain regions. The semiconductor layer 232 may comprise a material different from that of the fins 204, to apply stress to the fins 204 (especially, the channel regions therein). For example, in a case where the fins 204 comprise Si, the semiconductor layer 232 may comprise Si:C (where an atomic percentage of C is about 0.2-2%, for example) for an n-type device to apply tensile stress, or SiGe (where an atomic percentage of Ge is about 15-75%, for example) for a p-type device to apply compressive stress. Further, the semiconductor layer 232 expands the source/drain regions, facilitating formation of contacts to the source/drain regions.

As shown in FIG. 3, the gate stack intersects a side surface (opposite to the back gate 220) and a top surface of each of the fins 204. Specifically, the gate dielectric layer 238 may be in contact with the side surface and the top surface of each of the fins 204, and thus the gate conductor layer 240 may control generation of conductive channels on both the side surface and the top surface of each of the fins 204 via the gate dielectric layer 238. As a result, this semiconductor arrangement may be configured as a four-gate device.

FIGS. 4-21 are schematic views showing a flow of manufacturing a semiconductor arrangement according to an embodiment of the present disclosure.

Figure 4:
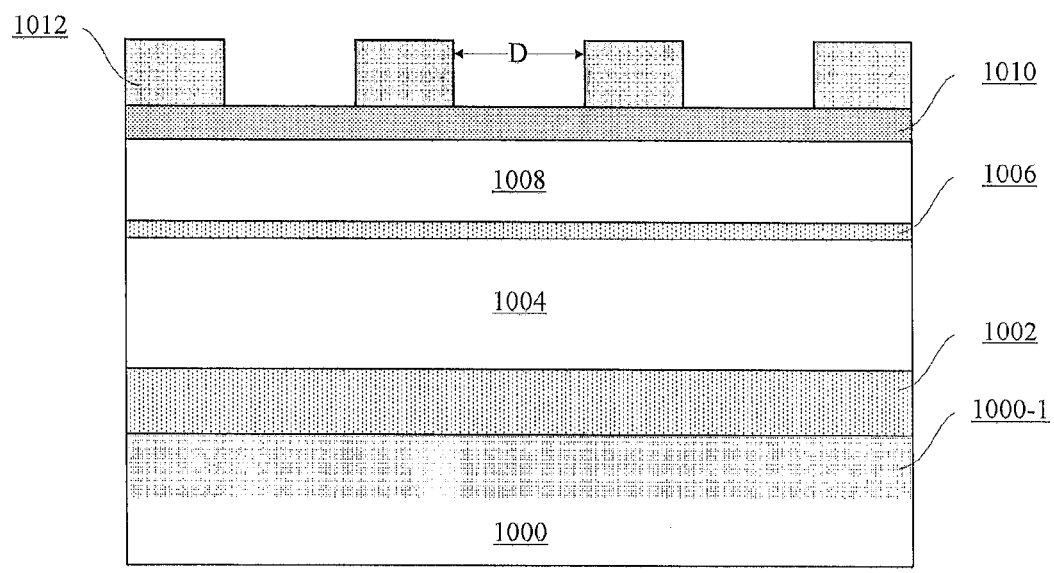
FIGS. 4-21 are schematic views showing a flow of manufacturing a semiconductor arrangement according to an embodiment of the present disclosure.

As shown in FIG. 4, a SOI substrate is provided. The SOI substrate may comprise a base substrate 1000 (e.g., silicon), a buried dielectric layer 1002 (e.g., oxide), and a SOI layer 1004 (e.g., silicon). In the base substrate 1000, a well region 1000-1 may be formed by, for example, ion implantation. For example, the well region may be formed to have a n-type conductivity for a p-type device, or a p-type conductivity for a n-type device. The n-type well region may be formed by implanting n-type impurities such as P or As into the substrate 1000, and the p-type well region may be formed by implanting p-type impurities such as B into the substrate 1000. Annealing may be performed after the implantation if needed. There are various ways to form the n-type well or p-type well, and detailed descriptions thereof are omitted here.

On the SOI substrate, a stop layer 1006, a patterning auxiliary layer 1008 and a protection layer 1010 may be sequentially formed. The stop layer 1006 may comprise oxide (e.g., silicon oxide) with a thickness of about 5-25 nm, the patterning auxiliary layer 1008 may comprise poly silicon with a thickness of about 50-200 nm, and the protection layer 1010 may comprise nitride (e.g., silicon nitride) with a thickness of about 5-15 nm. The materials for those layers are selected to provide etching selectivity in later processes. It is to be understood by those skilled in the art that those layers may comprise other suitable materials, and that some of them may be even omitted in some cases.

Next, a photoresist layer 1012 may be formed on the protection layer 1010. The photoresist layer 1012 may be patterned by, e.g., photolithography, to form openings therein at positions corresponding to back gates to be formed. The openings each may have a width D of about 15-100 nm.

Figure 5:
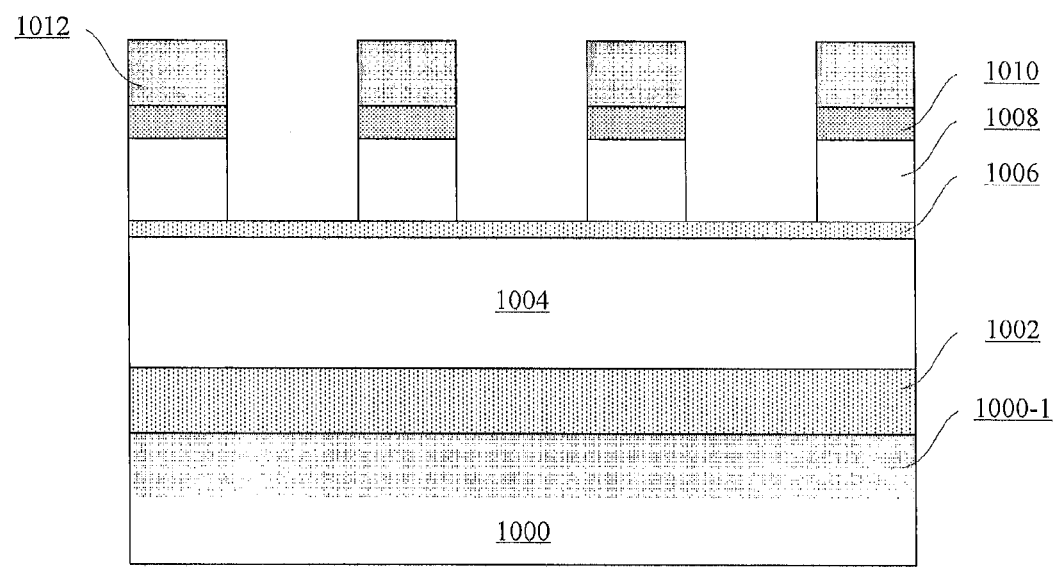

Then, as shown in FIG. 5, the protection layer 1010 and the patterning auxiliary layer 1008 may be sequentially etched by, e.g., reactive ion etching (RIE), with the photoresist layer 1012 as a mask, to form openings in the protection layer 1010 and the patterning auxiliary layer 1008. The etching may stop on the stop layer 1006. If the patterning auxiliary layer 1008 and the underlying SOI layer 1004 have sufficient etching selectivity with respect to each other, the stop layer 1006 may be even omitted. Then, the photoresist layer 1012 may be removed.

Figure 6:
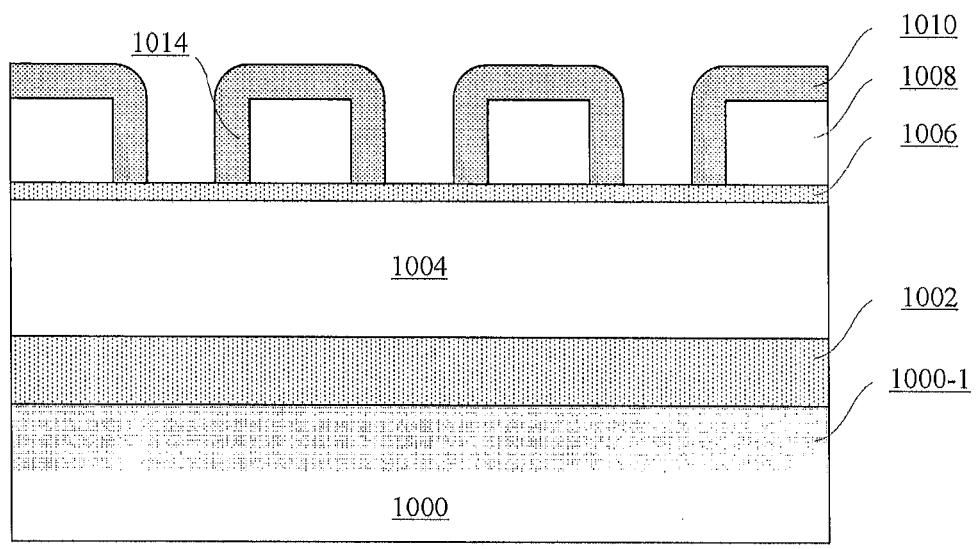

Then, as shown in FIG. 6, a pattern transfer layer 1014 may be formed on side walls of the patterning auxiliary layer 1008 (facing the openings). The pattern transfer layer 1014 may be formed in a spacer formation process. For example, a nitride layer may be deposited on a surface of the arrangement shown in FIG. 5 (with the photoresist layer 1012 removed), and then etched by RIE to form the pattern transfer layer as spacers. The deposited nitride layer may have a thickness of about 3-28 nm (which substantially determines a width of a fin to be formed). The deposition may comprise atomic layer deposition (ALD). There are various ways to form such spacers, and detailed descriptions thereof are omitted here.

Figure 7:
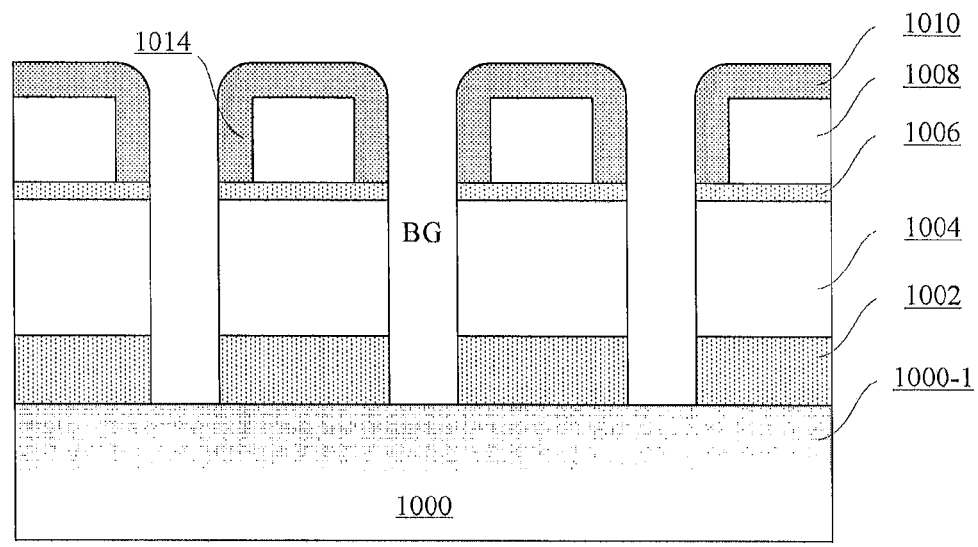

Next, as shown in FIG. 7, the SOI substrate may be patterned with the patterning auxiliary layer 1008 and the pattern transfer layer 1014 as a mask, to form back gate grooves BG therein. Here, the stop layer 1006, the SOI layer 1004, and the buried dielectric layer 1002 may be sequentially etched by RIE, to form the back gate grooves BG. Due to the presence of the protection layer 1010, the RIE has substantially no impact on the patterning auxiliary layer 1008. If the patterning auxiliary layer 1008 has sufficient etching selectivity with respect to the stop layer 1006, the SOI layer 1004 and the buried dielectric layer 1002, the protection layer 1010 may be even omitted. In the example of FIG. 7, the back gate grooves BG are shown as just reaching the well region 1000-1. However, the present disclosure is not limited thereto. For example, the back gate grooves BG may enter inside the well region 1000-1.

Figure 8:
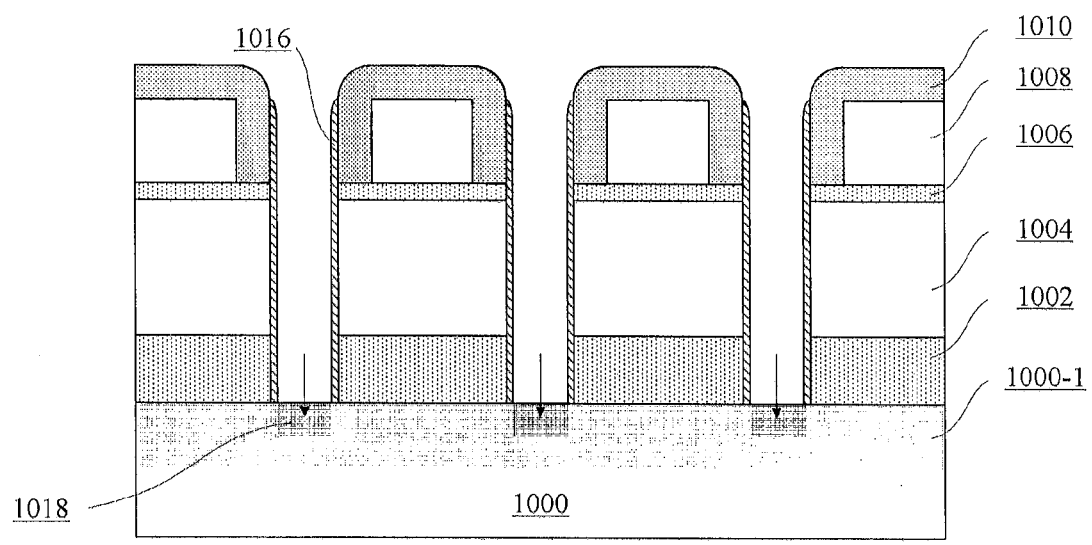

Subsequently, as shown in FIG. 8, back gate dielectric layers 1016 may be formed on side walls of the back gate grooves BG. The back gate dielectric layers 1016 may comprise any suitable dielectric material, for example, a high-K dielectric material such as $HfO_2$. Here, the back gate dielectric layers 1016 may be formed in a spacer formation process. For example, a dielectric layer may be deposited on a surface of the arrangement of FIG. 7, and then etched by RIE, to form the back gate dielectric layers as spacers.

Here, to reduce a contact resistance between the back gates to be formed and the base substrate, ion implantation may be performed through the back gate grooves BG, as shown by arrows in FIG. 8, to form contact regions 1018 in the base substrate 1000 (especially, in the well region 1000-1). The ion implantation has the same doping polarity as the well region, and thus the contact regions 1018 may have a greater doping concentration (e.g., $1E18-1E21$ $cm^{-3}$) than that of the well region 1000-1.

Figure 9:
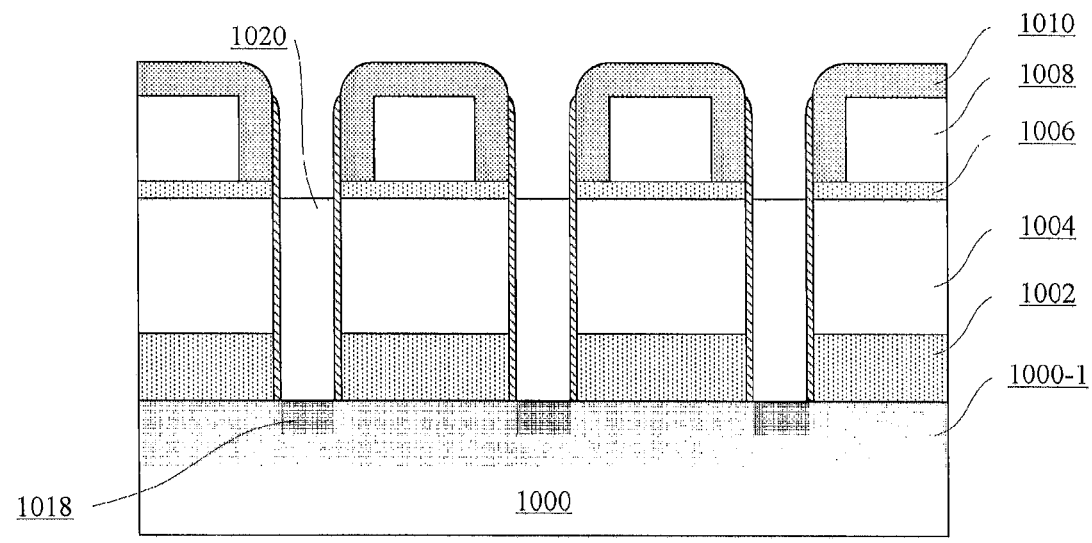

Then, as shown in FIG. 9, a conductive material may be filled into the back gate grooves BG, to form the back gates 1020. The back gates 1020 may comprise metal such as TiN, W, or a combination thereof. The conductive material may be deposited by ALD, so that the conductive material fully fills the back gate grooves BG. The deposited conductive material may be etched back to form the back gates 1020. In an example, the back gates 1020 each may have a top surface substantially flush with or (slightly) higher than that of the SOI layer 1004 (corresponding to a top surface of fins to be formed). Alternatively, the back gates 1020 may comprise a doped (and thus conductive) semiconductor material such as poly silicon at a polarity which can be selected to adjust a threshold voltage.

After the back gates are formed as described above, the SOI layer may be patterned to form the fins.

Figure 10:
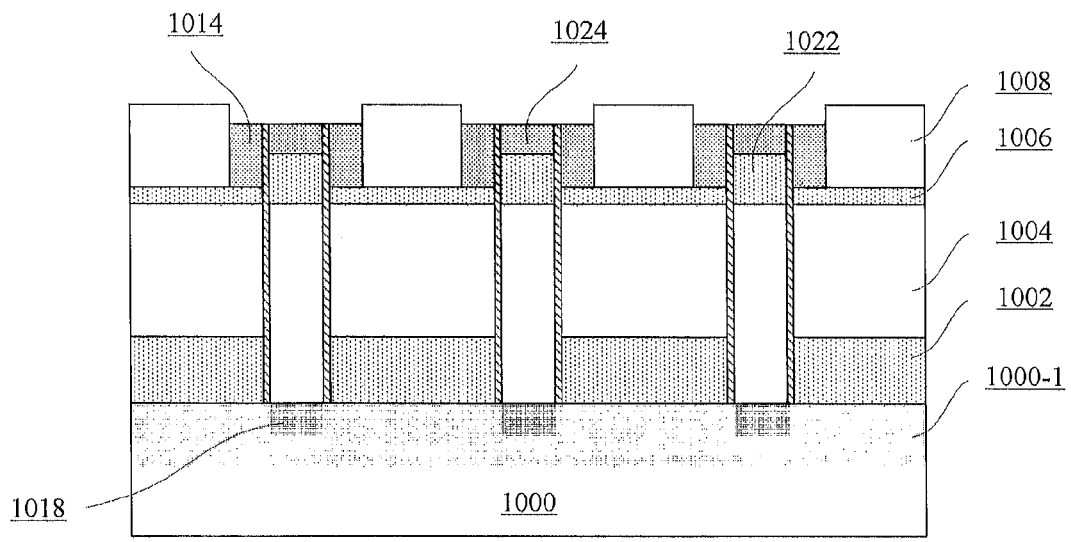

In this embodiment, sFinFETs with a gate stack intersecting the fins are to be formed. To avoid interference between the back gates 1020 and the gate stack, a dielectric layer 1022 may be further filled into the back gate grooves BG to cover the back gates 1020, as shown in FIG. 10. For example, the dielectric layer 1022 may comprise oxide, and may be formed by depositing and then etching back an oxide layer. Further, in a case where the stop layer 1006 of oxide is formed as described above, to avoid unwanted impacts on the dielectric layer 1022 during latter patterning of the SOI layer 1004 (which involves the stop layer 1006), a protection layer 1024 of, e.g., nitride may be formed on the dielectric layer 1022. The protection layer 1024 may be formed by depositing and then etching back a nitride layer. During the etching back, the protection layer 1010 on a top surface of the patterning auxiliary layer 1008 may be removed, to expose the patterning auxiliary layer 1008, as shown in FIG. 10.

Figure 11:
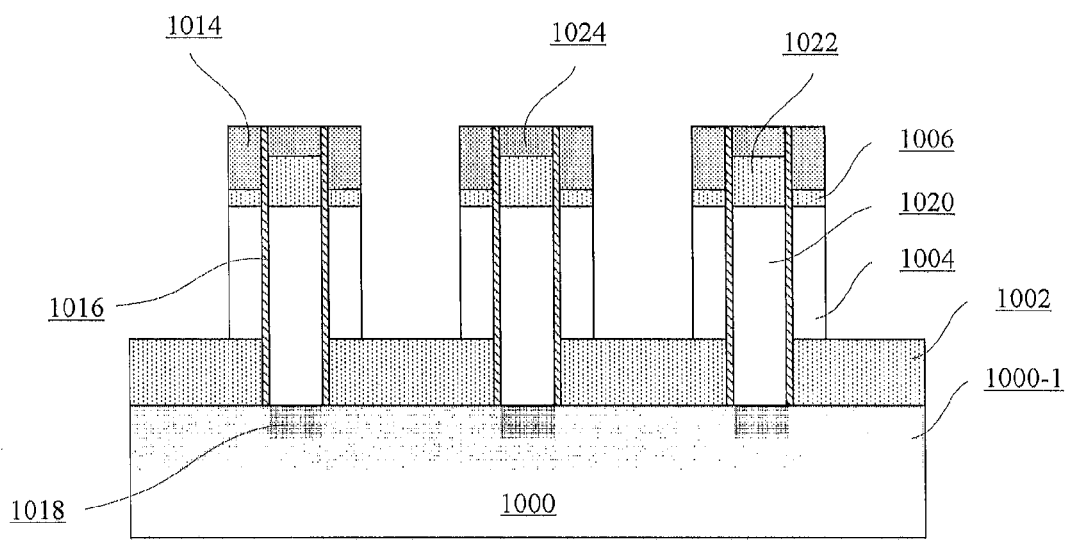

Next, as shown in FIG. 11, the patterning auxiliary layer 1008 may be removed by selective etching, for example, wet etching with TMAH solution, to leave the pattern transfer layer 1014. Then, the stop layer 1006 and the SOI layer 1004 may be selectively etched by, e.g., RIE, with the pattern transfer layer 1014 as a mask. As a result, fin-like portions of the SOI layer are left on opposite sides of the respective back gates 1020. Those fin-like portions correspond to the pattern transfer layer 1014 in shape, and can constitute fins for devices to be formed.

In this way, a sFin configuration according to this embodiment is achieved. As shown in FIG. 11, the sFin configuration comprises the back gate 1020 and the fins 1004 on opposite sides of the back gate 1020, with the back gate dielectric layers 1016 interposed between the back gate 1020 and the respective fins 1004. Further, in this sFin, the fins 1004 have their top surfaces covered by some dielectric layers (including the stop layer 1006 and the pattern transfer layer 1014). In this case, the gate stack to be formed later may intersect a side surface of each of the fins (opposite to the back gate 1020), and thus control generation of a channel on this side surface, resulting in a double-gate device.

Figure 12:
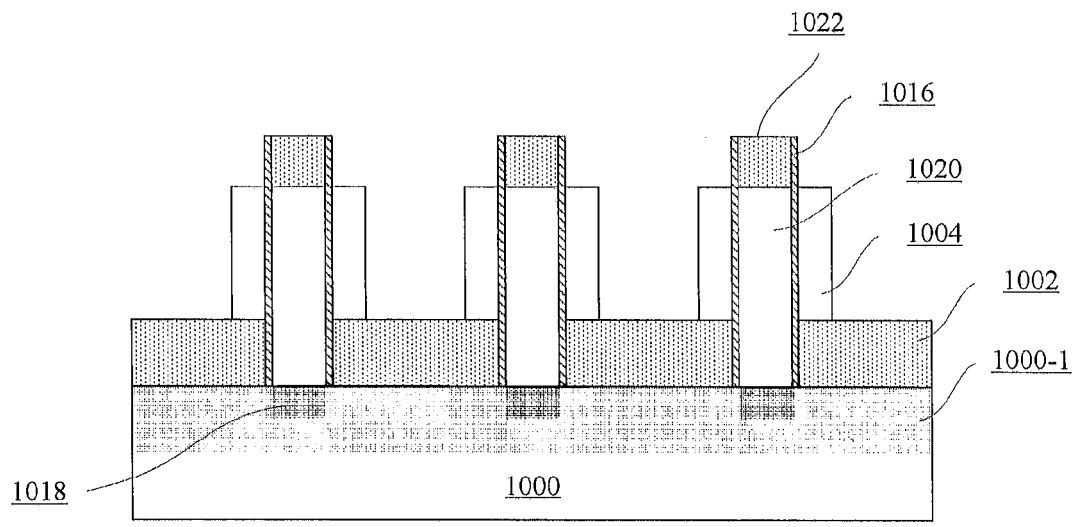

To improve the device performance, the dielectric layers on the top surfaces of the fins 1004 may be removed. Specifically, the pattern transfer layer 1014 (together with the protection layer 1024 because both of them comprise nitride in this example) and the stop layer 1006 may be selectively removed by, e.g., RIE, to expose the top surfaces of the fins 1004, as shown in FIG. 12. Here, the dielectric layer 1022 may have its thickness sufficiently greater than that of the stop layer 1006, and thus can be left. Further, portions of the back gate dielectric layers 1016 beyond a top surface of the dielectric layer 1022 can be substantially removed, because they are relatively thin and will lose support during the removing of the pattern transfer layer 1014 and the protection layer 1024. Thus, in the sFin shown in FIG. 12, the gate stack to be formed later may intersect a side surface (opposite to the back gate 1020) and a top surface of each of the fins, and thus control generation of channels on both the side surface and the top surface, resulting in a four-gate device. In this way, it is possible to improve the current drive capability of the devices.

After the sFins (as shown in FIG. 11 or 12) are formed as described above, various devices may be formed based on the sFins. In the example shown in FIGS. 11 and 12, there are three sFins. However, the present disclosure is not limited thereto. For example, more or less sFins may be formed as desired, and the sFins may be formed in a different layout than that shown in the figures where the sFins are disposed in parallel.

In the following, an exemplary flow of making sFinFETs based on the sFins shown in FIG. 12 will be described.

Figure 13:
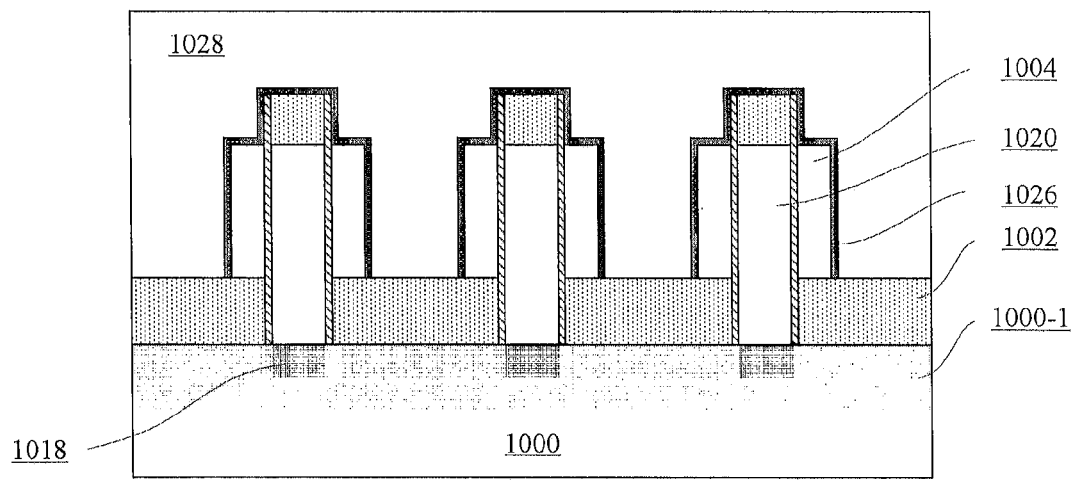

To make the sFinFETs, a gate stack may be formed on the SOI substrate (specifically, on the buried dielectric layer 1002) to intersect the sFins. For example, this can be done as follows. Specifically, as shown in FIG. 13, a gate dielectric layer 1026 may be formed by, e.g., deposition. For example, the gate dielectric layer 1026 may comprise oxide, with a thickness of about 0.8-1.5 nm. In the example shown in FIG. 13, the dielectric layer 1026 is shown to be on side and top surfaces of the sFins. However, the dielectric layer 1026 may extend onto a top surface of the buried dielectric layer 1002. Then, a gate conductor layer 1028 may be formed by, e.g., deposition. For example, the gate conductor layer 1028 may comprise poly silicon. The gate conductor layer 1028 may fill gaps between the sFins, and be planarized by, e.g., CMP.

Figure 14:
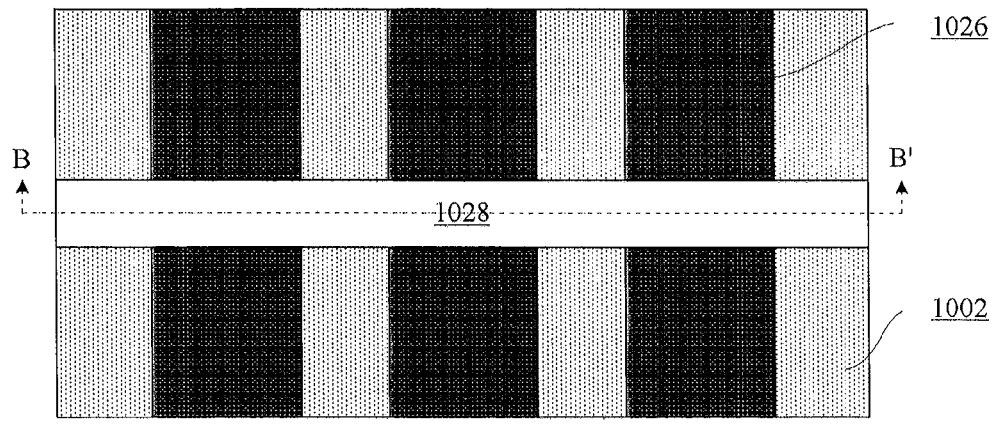
Figure 14:
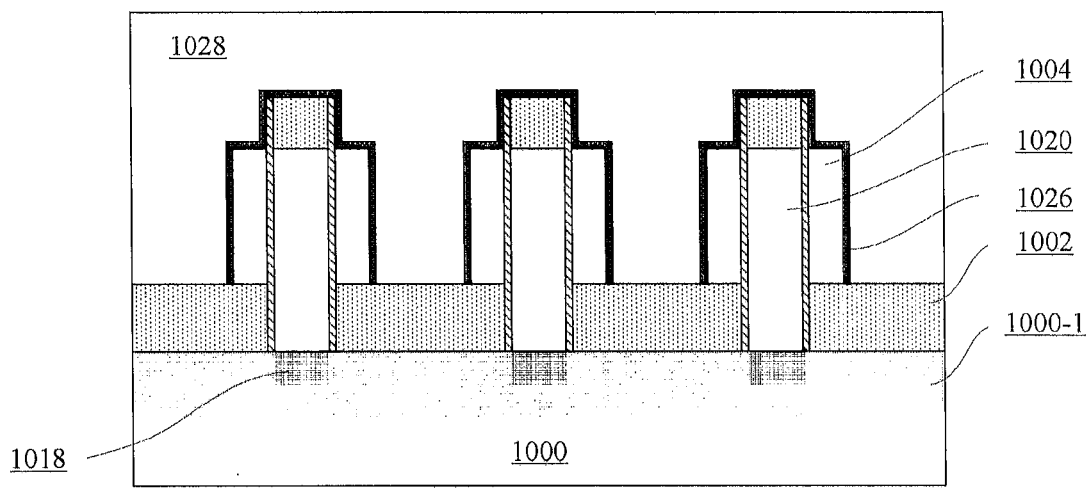

As shown in FIG. 14 (where FIG. 14(b) is a sectional view taken along BB' in FIG. 14(a)), the gate conductor layer 1028 may be patterned. In the example shown in FIG. 14, the gate conductor layer 1028 may be patterned to a bar crossing the sFins. According to a further embodiment, the gate dielectric layer 1026 may be further patterned with the patterned gate conductor layer 1028 as a mask.

After formation of the patterned gate conductor, halo implantation and extension implantation may be carried out with the gate conductor as a mask.

Figure 15:
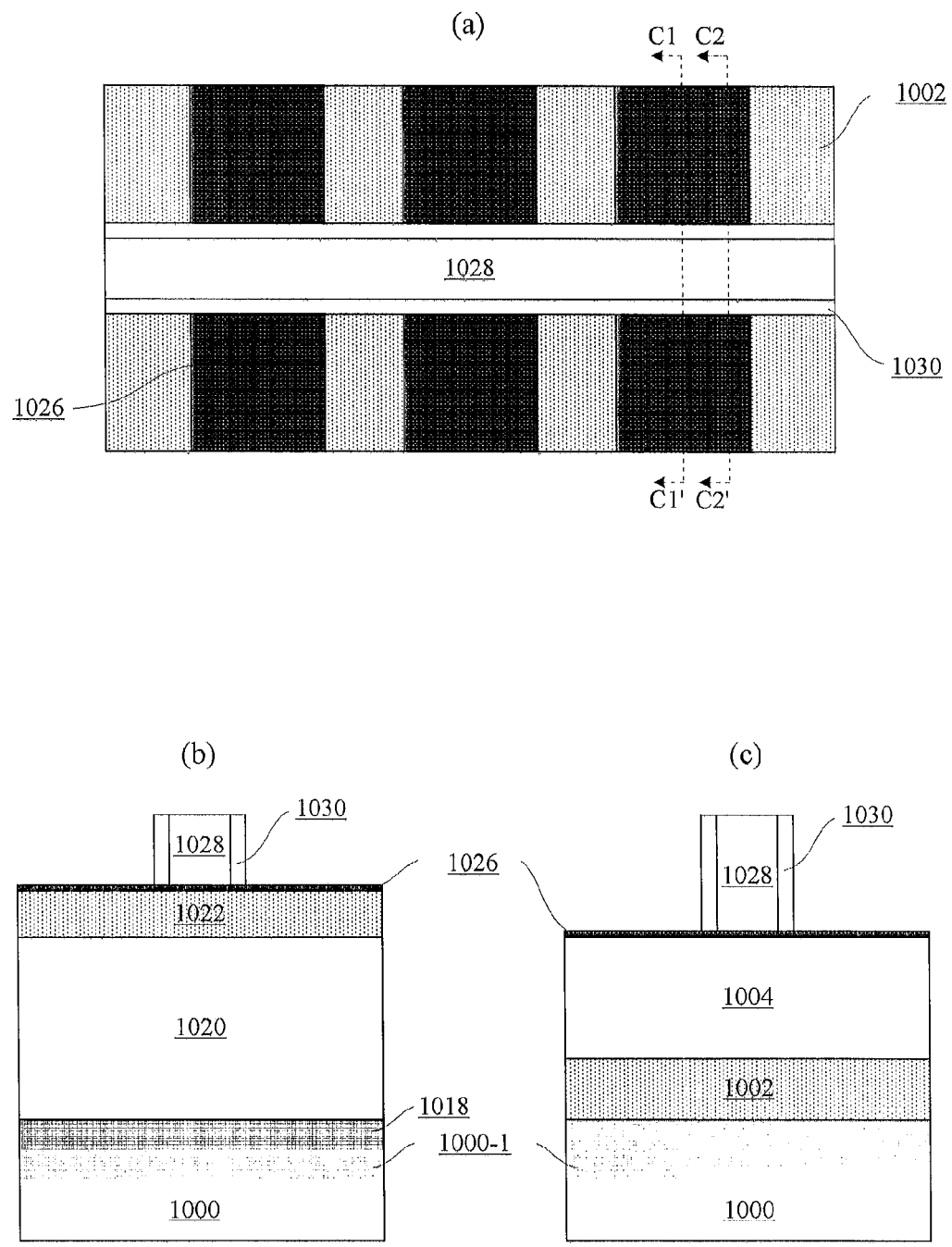

Next, as shown in FIG. 15 (where FIG. 15(b) is a sectional view taken along C1C1' in FIG. 15(a), and FIG. 15(c) is a sectional view taken along C2C2' in FIG. 15(a)), gate spacers 1038 may be formed on side walls of the gate conductor layer 1028. For example, a nitride layer (e.g., silicon nitride) with a thickness of about 5-20 nm may be deposited and then etched by RIE, to form the spacers 1030. Here, the amount of RIE may be controlled in forming the gate spacers, so that the gate spacers 1030 have substantially no portions on the side walls of the sFins. There are various ways to form the spacers, and detailed descriptions thereof are omitted here.

After formation of the spacers, source/drain (S/D) implantation may be carried out with the gate conductor and the spacers as a mask. Then, annealing may be performed to activate implanted ions to form S/D regions, resulting in sFinFETs.

Figure 16:
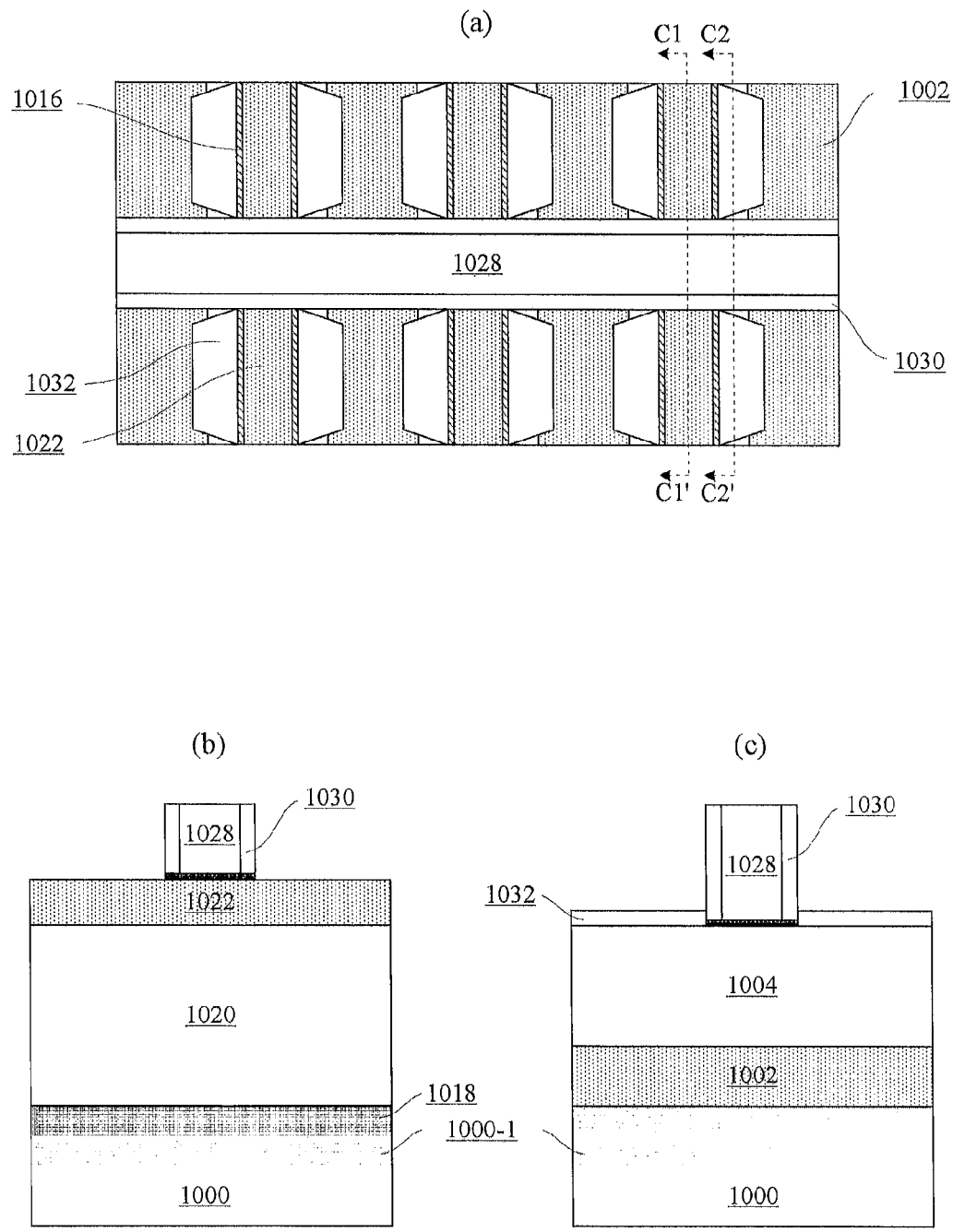

To improve the device performance, in an example strained SID technology may be utilized. Specifically, as shown in FIG. 16 (where FIG. 16(b) is a sectional view taken along C1C1' in FIG. 16(a), and FIG. 16(c) is a sectional view taken along C2C2' in FIG. 16(a)), on exposed surfaces of the fins 1004 by the gate stack (corresponding to the S/D regions), a semiconductor layer 1032 may be formed by epitaxy. In an example, the semiconductor layer 1032 may be doped in-situ during the epitaxy. For example, the semiconductor layer 1032 may be n-type doped in-situ for an n-type device, or p-type doped in situ for a p-type device. To further improve the device performance, the semiconductor layer 1032 may comprise a different material from the fins 1004, to apply stress to the fins 1004 (where the channel regions are to be formed). For example, in a case where the fins 1004 comprise Si, the semiconductor layer 1032 may comprise Si:C (where an atomic percentage of C may be about 0.2-2%, for example) for a n-type device to apply tensile stress, or SiGe (where an atomic percentage of Ge may be about 15-75%, for example) for a p-type device to apply compressive stress. On the other hand, the grown semiconductor layer 1032 extends laterally to an extent, facilitating formation of contacts to the S/D regions.

In FIG. 16(c), it is shown that edges of the semiconductor layer 1032 coincide with those of the fin 1004. However, there may be some deviations. Further, in a case where the gate conductor layer 1028 comprises poly silicon, growth of the semiconductor layer 1032 may also occur on the gate conductor layer 1028. This is not shown in the figure.

In the above embodiment, the gate stack is directly formed after formation of the sFins. However, the present disclosure is not limited thereto. For example, a gate last process may be used.

According to another embodiment of the present disclosure, the gate dielectric layer 1026 and the gate conductor layer 1028 shown in FIG. 13 are a sacrificial gate dielectric layer and a sacrificial gate conductor layer, respectively. (In this case, operations described with reference to FIGS. 13 and 14 result in a sacrificial gate stack.) Next, the gate spacers 1030 may be formed in the same way as described above with reference to FIG. 15. Likewise, the strained S/D technology may be also applied as described with reference to FIG. 16.

Then, the sacrificial gate stack may be handled according to the gate last process to form a real gate stack. For example, this can be done as follows.

Figure 17:
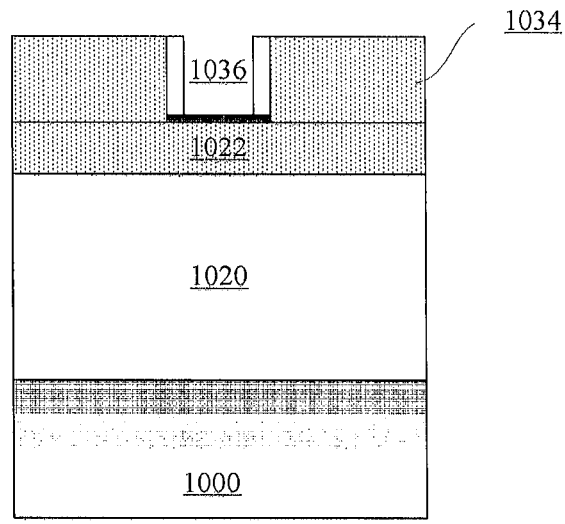
Figure 17:
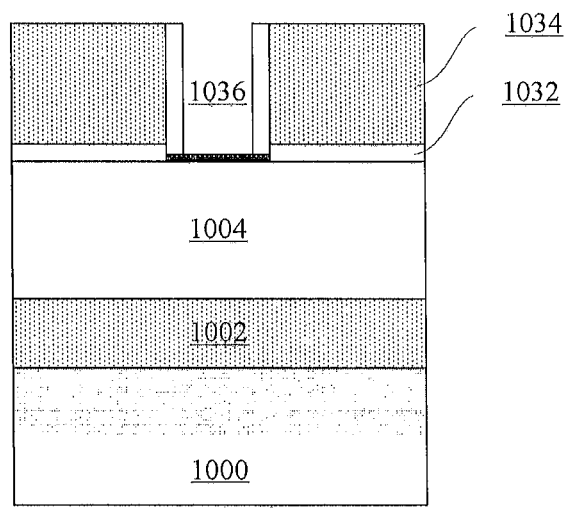

Specifically, as shown in FIG. 17 (where FIG. 17(a) is a sectional view corresponding to that of FIG. 16(b), and FIG. 17(b) is a sectional view corresponding to that of FIG. 16(c)), a dielectric layer 1034 may be formed by, e.g., deposition. The dielectric layer 1034 may comprise oxide. Then, the dielectric layer 1034 may be planarized by, e.g., CMP. The CMP may stop at the gate spacers 1030, and thus the sacrificial gate conductor layer 1028 is exposed. Next, the sacrificial gate conductor layer 1028 may be selectively removed by means of, e.g., TMAH solution, leaving a gate groove 1036 between the gate spacers 1030. According to a further embodiment, the sacrificial gate dielectric layer 1026 may be further removed.

Figure 18:
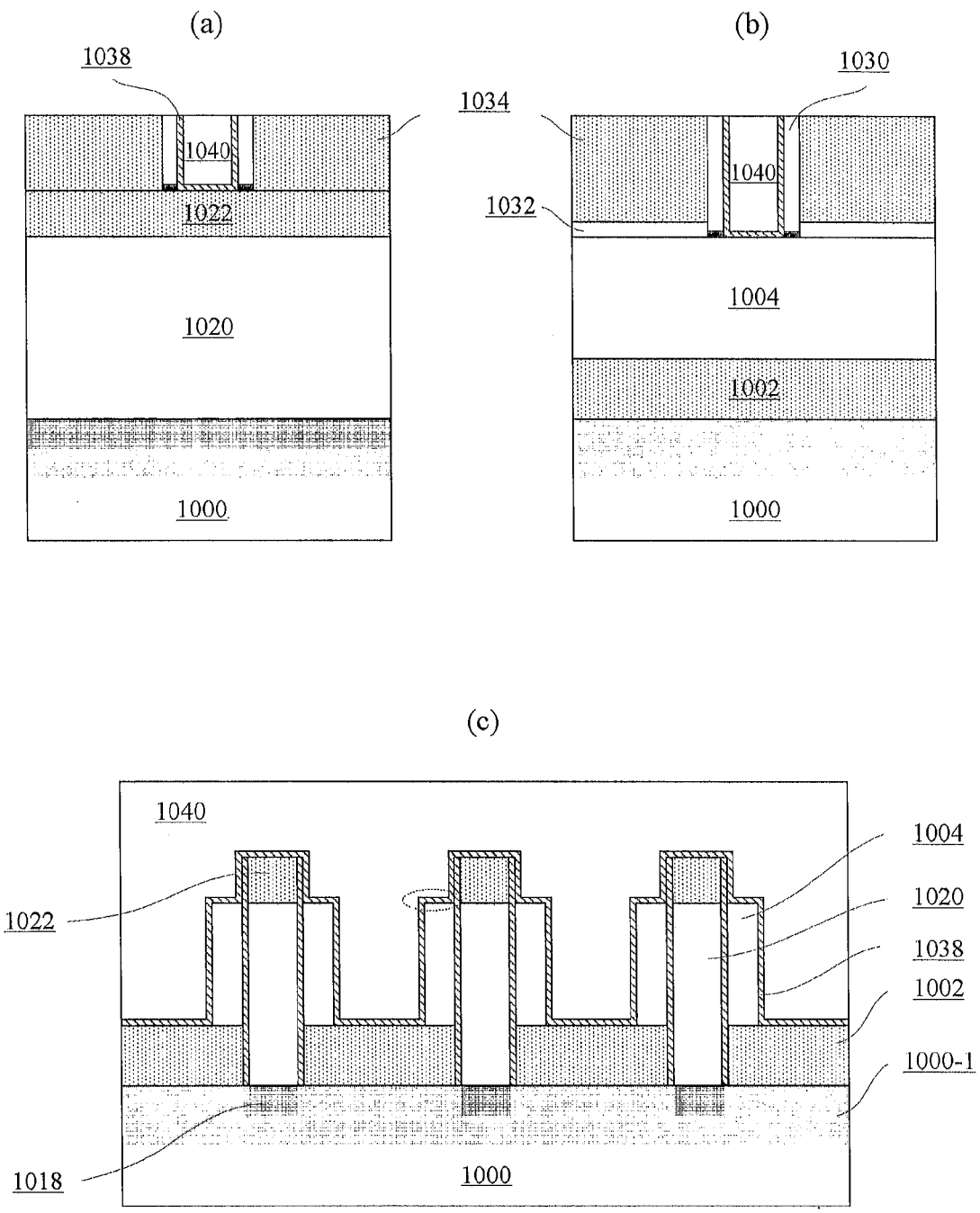
Figure 19:
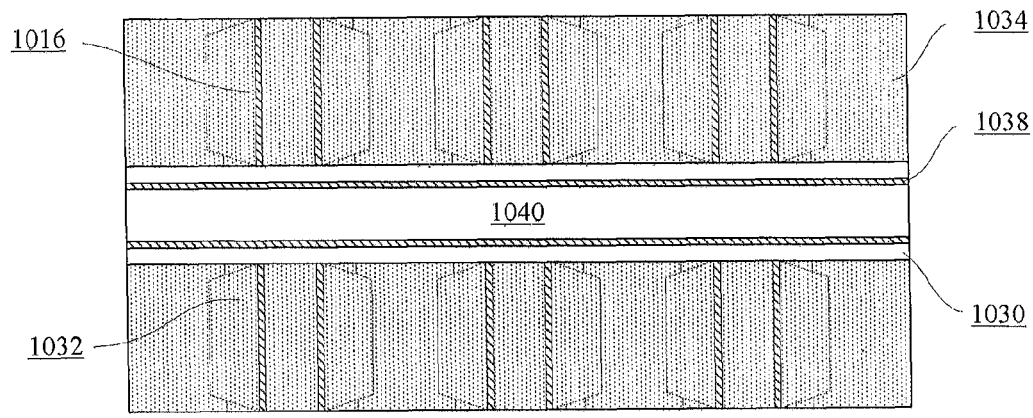

Then, as shown in FIG. 18 (where FIG. 18(a) is a sectional view corresponding to that of FIG. 17(a), FIG. 18(b) is a sectional view corresponding to that of FIG. 17(b), and FIG. 18(c) is a sectional view corresponding to that of FIG. 14(b)) and FIG. 19 (which is a top view showing the arrangement of FIG. 18), a final gate stack may be formed by forming a gate dielectric layer 1038 and a gate conductor layer 1040 in the gate groove. The gate dielectric layer 1038 may comprise a high-K gate dielectric material such as $HfO_2$, with a thickness of about 1-5 nm. Further, the gate dielectric layer 1038 may further comprise a thin oxide layer (on which the high-K gate dielectric is disposed), with a thickness of about 0.3-1.2 nm. The gate conductor layer 1040 may comprise a metal gate conductor. There may be a work function adjustment layer (not shown) interposed between the gate dielectric layer 1038 and the gate conductor layer 1040.

Thus, sFinFETs according to this embodiment are achieved. As shown in FIGS. 18 and 19, the sFinFET comprises the gate stack (including the gate dielectric layer 1038 and the gate conductor layer 1040) formed on the SOI layer 1002 and intersecting the sFin (including the back gate 1020 and the fins 1004). As clearly shown in FIG. 18(c), the gate conductor layer 1040 may control generation of conductive channels in a side surface (opposite to the back gate 1020) and a top surface of each of the fins 1004 via the gate dielectric layer 1038. As a result, the sFinFET is a four-gate device. Further, the back gate 1020 may control the fins 1004 via the respective back gate dielectric layers 1016, and thus adjust the threshold of the sFinFET as desired. The back gate 1020 is electrically isolated from the gate stack by the dielectric layer 1022.

Figure 20:
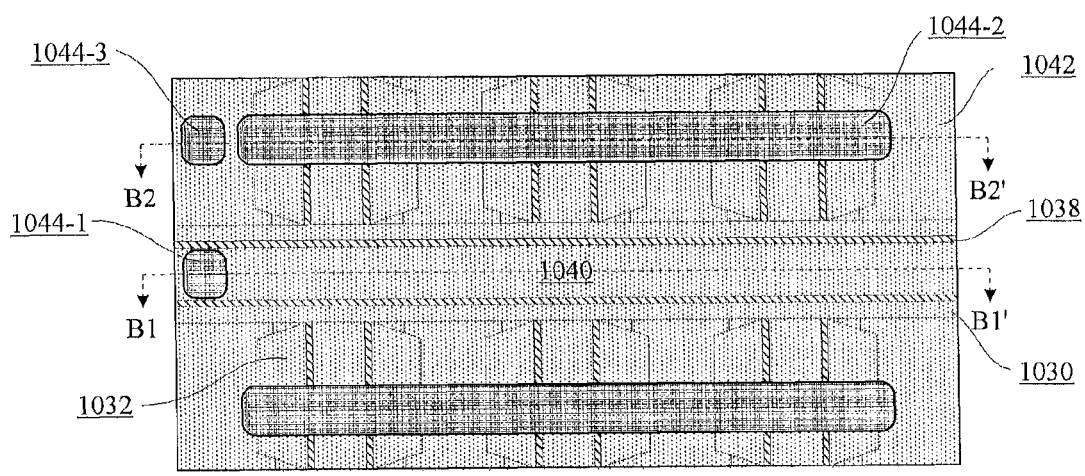

After formation of the sFinFETs, various electric contacts may be formed. For example, as shown in FIG. 20, an interlayer dielectric (ILD) layer 1042 may be formed on a surface of the arrangement of FIG. 19. The ILD layer 1042 may comprise oxide. The ILD layer 1042 may be planarized by, e.g., CMP, to have a substantially planar surface. Then, contact holes may be formed by means of, e.g., photolithography, and then filled by a conductive material, e.g., metal (such as W, Cu, or the like), to form contacts, such as a contact 1044-1 to the gate stack, contacts 1044-2 to the S/D regions, and a contact 1044-3 to the back gate.

Figure 21:
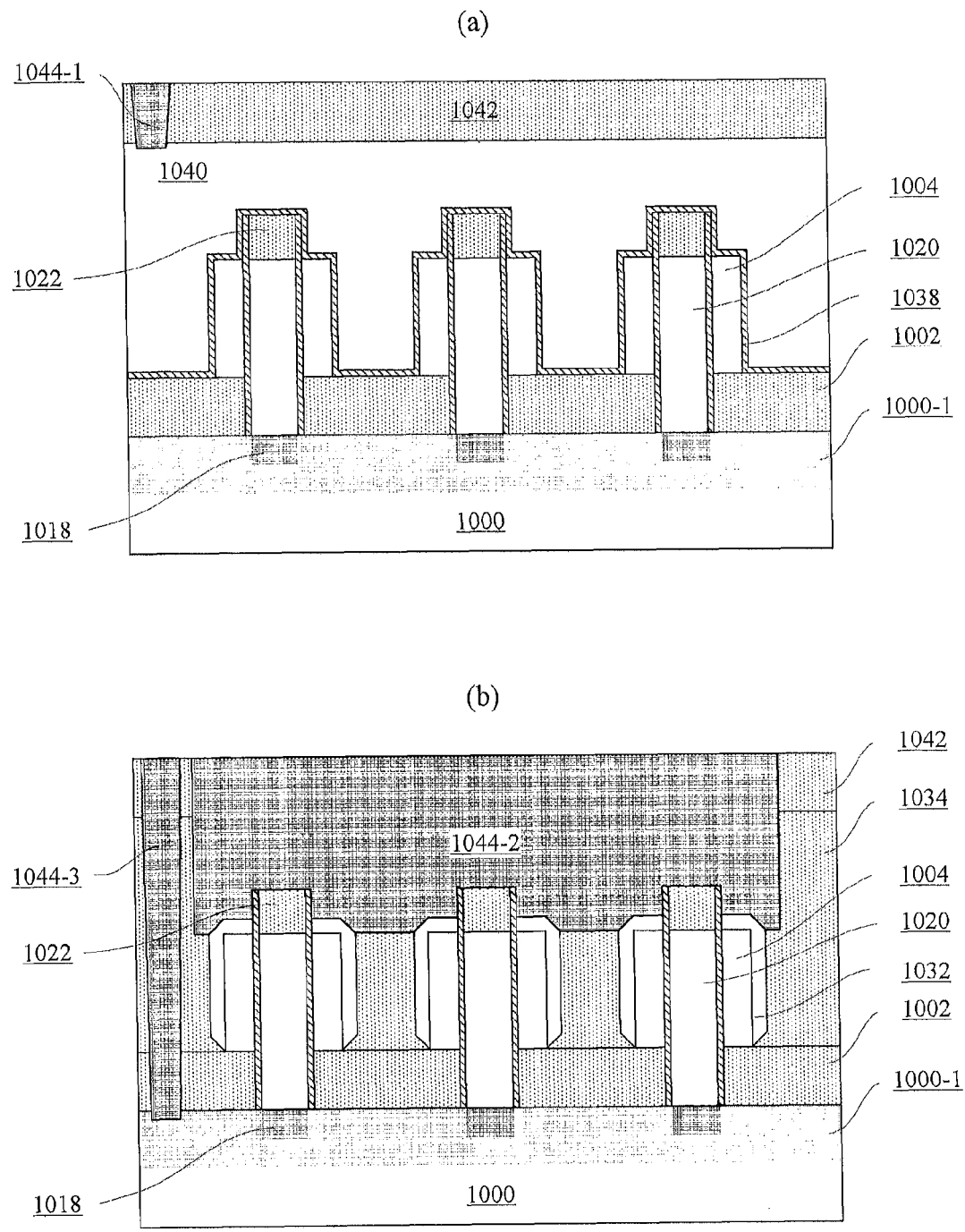

FIG. 21 shows sectional views taken along B1B1' and B2B2' of FIG. 20 in (a) and (b), respectively. As shown in FIG. 21, the contact 1044-1 passes through the ILD layer 1042, and reaches, and thus is in electric contact with, the gate conductor 1040; the contacts 1044-2 pass through the ILD layer 1042 and the dielectric layer 1034, and accesses, and thus are in electric contact with, the S/D regions (the semiconductor layer 1032 in this example); and the contact 1044-3 passes through the ILD layer 1042, the dielectric layer 1034, and the buried dielectric layer 1002, and reaches the base substrate 1000 (especially, the well region 1000-1) and thus is in electric contact with the back gate 1020. Desired electrical signals may be applied through those electrical contacts.

In FIG. 21, the source or drain regions of the three sFinFETs are shown to be connected to the same contact. However, the present disclosure is not limited thereto. Different connections can be made based on different designs.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising:
   a semiconductor on insulator (SOI) substrate, comprising a base substrate, a buried dielectric layer, and a SOI layer;
   a back gate formed on the SOI substrate and passing through the buried dielectric layer to be in electric contact with the base substrate;
   fins formed from the SOI layer on opposite sides of the back gate;
   back gate dielectric layers interposed between the back gate and the respective fins; and
   a gate stack formed on the buried dielectric layer and intersecting the fins and the back gate, wherein the gate stack is isolated from the back gate by a dielectric layer, wherein the gate stack comprises a gate dielectric layer and a gate conductor layer formed on the gate dielectric layer, wherein the gate dielectric layer is in contact with a side surface opposite to the back gate and a top surface of each of the fins and wherein the gate stack is operative to create a conductive channel at both the side surface and the top surface.

2. The semiconductor arrangement according to claim 1, wherein the back gate has its top surface substantially flush with or higher than that of each of the fins.

3. The semiconductor arrangement according to claim 1, wherein the back gate comprises a conductive material, with a width of about 5-30 nm.

4. The semiconductor arrangement according to claim 1, wherein one or more of the fins comprises any of Si, Ge, SiGe, GaAs, GaSb, AlAs, InAs, InP, GaN, SiC, InGaAs, InSb, or InGaSb, with a width of about 3-28 nm.

5. The semiconductor arrangement according to claim 1, further comprising a well region in the base substrate, wherein the back gate is in electric contact with the well region.

6. The semiconductor arrangement according to claim 5, wherein the well region is doped to have an n-type conductivity in a case where the semiconductor arrangement is used for a p-type device, or is doped to have a p-type conductivity in a case where the semiconductor arrangement is used for an n-type device.

7. The semiconductor arrangement according to claim 6, further comprising a contact region in the well region at a position corresponding to the back gate and having a doping concentration greater than that of the well region.

8. The semiconductor arrangement according to claim 1, wherein the back gate dielectric layer comprises a high-K dielectric material, with a thickness of about 2-20 nm.

9. The semiconductor arrangement according to claim 1, further comprising a semiconductor layer grown on surfaces of portions of each of the fins on opposite sides of the gate stack.

10. The semiconductor arrangement according to claim 9, wherein the semiconductor layer is compressive stressed if the semiconductor arrangement is used for a p-type device, or is tensile stressed if the semiconductor arrangement is used for an n-type device.

11. The semiconductor arrangement according to claim 10, wherein the semiconductor layer comprises SiGe or Si:C.

12. A method of manufacturing a semiconductor arrangement, the method comprising:
   forming a back gate groove in a semiconductor on insulator (SOI) substrate, wherein the SOI substrate comprises a base substrate, a buried dielectric layer, and a SOI layer, and the back gate groove passes through the SOI layer and the buried dielectric layer;
   forming back gate dielectric layers on side walls of the back gate groove;
   forming a back gate by filling a conductive material into the back gate groove so as to be in electric contact with the base substrate;
   forming fins abutting the respective back gate dielectric layers and on opposite sides of the back gate, by patterning the SOI layer so that the back gate dielectric layers are interposed between the back gate and the respective fins; and forming a gate stack on the buried dielectric layer, the gate stack intersecting the fins and the back gate and the gate stack being isolated from the back gate by a dielectric layer, wherein the gate stack comprises a gate dielectric layer and a gate conductor layer formed on the gate dielectric layer, wherein the gate dielectric layer is in contact with a side surface opposite to the back gate and a top surface of each of the fins and wherein the gate stack is operative to create a conductive channel at both the side surface and the top surface.

13. The method according to claim 12, wherein forming the back gate groove comprises:
   forming a patterning auxiliary layer on the SOI substrate and patterning the patterning auxiliary layer to have an opening at a position corresponding to the back gate groove;
   forming a pattern transfer layer on side walls of the patterning auxiliary layer facing the opening;
   forming the back gate groove by etching the SOI substrate with the patterning auxiliary layer and the pattern transfer layer as a mask, and forming the fins comprises:
   selectively removing the patterning auxiliary layer; and
   forming the fins by etching the SOI layer with the pattern transfer layer as a mask.

14. The method according to claim 13, wherein the conductive material filled into the back gate groove has its top surface substantially flush with or higher than that of the SOI layer.

15. The method according to claim 13, further comprising, after forming the back gate and before patterning the SOI layer, forming a dielectric layer in the back gate groove to cover the back gate.

16. The method according to claim 13, wherein the SOI layer comprises any of Si, Ge, SiGe, GaAs, GaSb, AlAs, InAs, InP, GaN, SiC, InGaAs, InSb, or InGaSb, and the patterning auxiliary layer comprises amorphous silicon, and
   wherein the method further comprises forming a protection layer on a top surface of the patterning auxiliary layer to protect the patterning auxiliary layer during the etching of the back gate groove.

17. The method according to claim 16, further comprising forming a stop layer on the SOI substrate on which the patterning auxiliary layer is disposed.

18. The method according to claim 17, wherein the protection layer comprises nitride, the pattern transfer layer comprises nitride, and the stop layer comprises oxide.

19. The method according to claim 13, wherein the pattern transfer layer is formed on the side walls of the patterning auxiliary layer in a spacer formation process.

20. The method according to claim 13, further comprising, after forming the fins, selectively removing the pattern transfer layer.

21. The method according to claim 12, further comprising, after forming the back gate dielectric layers and before filling the back gate groove, forming a well region in the base substrate by ion implantation through the back gate groove.

22. The method according to claim 12, wherein the back gate dielectric layers are formed on the side walls of the back gate groove in a spacer formation process.

23. The method according to claim 12, further comprising growing a semiconductor layer on surfaces of portions of each of the fins on opposite sides of the gate stack.

24. The method according to claim 23, wherein the semiconductor layer is compressive stressed if the semiconductor arrangement is used for a p-type device, or is tensile stressed if the semiconductor arrangement is used for an n-type device.

\* \* \* \* \*